(12) United States Patent
Lee

(10) Patent No.: US 7,863,601 B2
(45) Date of Patent: Jan. 4, 2011

(54) ORGANIC LIGHT EMITTING DISPLAY, METHOD OF FABRICATING THE SAME, AND MOBILE DISPLAY INCLUDING THE ORGANIC LIGHT EMITTING DISPLAY

(75) Inventor: Kwan Hee Lee, Seoul (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 1056 days.

(21) Appl. No.: 11/583,060

(22) Filed: Oct. 19, 2006

(65) Prior Publication Data

US 2007/0090340 A1   Apr. 26, 2007

(30) Foreign Application Priority Data

Oct. 20, 2005   (KR) ................ 10-2005-0099381

(51) Int. Cl.
   *H01L 51/50*  (2006.01)
   *H01J 1/70*  (2006.01)
(52) U.S. Cl. ............ 257/40; 313/512; 257/E51.02; 438/99
(58) Field of Classification Search ........... 257/40, 257/E51.001–E51.052; 438/99; 313/512
   See application file for complete search history.

(56) References Cited

U.S. PATENT DOCUMENTS

| | | | |
|---|---|---|---|
| 6,692,986 B1 * | 2/2004 | Bayer et al. | ............ 438/99 |
| 7,183,580 B2 | 2/2007 | Hayashi et al. | |
| 2004/0115859 A1 * | 6/2004 | Murayama et al. | ............ 438/99 |
| 2004/0212759 A1 * | 10/2004 | Hayashi | ............ 349/84 |
| 2005/0062414 A1 | 3/2005 | Hsiao et al. | |
| 2005/0110020 A1 * | 5/2005 | Hayashi et al. | ............ 257/72 |
| 2006/0082298 A1 | 4/2006 | Becken et al. | |

FOREIGN PATENT DOCUMENTS

| | | |
|---|---|---|
| EP | 1 670 292 | 6/2006 |
| JP | 04-363893 A | 12/1992 |
| JP | 08-222368 | 8/1996 |
| JP | 09-274990 | 10/1997 |
| JP | 2001-326076 A | 11/2001 |
| JP | 2002-025769 A | 1/2002 |
| JP | 2004-103442 | 4/2004 |
| JP | 2004-139930 A | 5/2004 |
| JP | 2005-129520 | 5/2005 |
| JP | 2005-251721 A | 9/2005 |
| TW | I232693 B | 5/2005 |
| TW | 2005-33983 A | 10/2005 |
| TW | 2008-11923 | 10/2007 |
| WO | WO 2004/020690 A1 | 3/2004 |

* cited by examiner

*Primary Examiner*—Matthew W Such
(74) *Attorney, Agent, or Firm*—Lee & Morse, P.C.

(57) ABSTRACT

An organic light emitting display and a method of fabricating the same are disclosed. The organic light emitting display may include a transistor on a substrate, a lower electrode on the substrate, the lower electrode being electrically connected to the transistor, an organic light emitting layer on the lower electrode, an upper electrode on the organic light emitting layer, and a buffer layer formed on the upper electrode to modify a predetermined thickness of the upper electrode to be a non-conductive material.

18 Claims, 5 Drawing Sheets

ORGANIC LIGHT EMITTING DISPLAY, METHOD OF FABRICATING THE SAME, AND MOBILE DISPLAY INCLUDING THE ORGANIC LIGHT EMITTING DISPLAY

BACKGROUND OF THE INVENTION

1. Field of the Invention

The present invention relates to an organic light emitting display, a method of fabricating the same, and a mobile display including the organic light emitting display. More particularly, the present invention relates to an organic light emitting display that is capable of preventing a dark point from being generated, a method of fabricating the same, and a mobile display including the organic light emitting display.

2. Description of the Related Art

A conventional organic light emitting display (OLED) may include a light emitting unit 120, as illustrated in FIG. 10, to be electrically connected to, e.g., a thin film transistor (TFT) (not shown) on a substrate 100. The light emitting unit 120 may include a lower electrode 121, an organic light emitting layer 122, and an upper electrode 123.

In the conventional OLED having the above-described structure, as illustrated in FIG. 10, the organic light emitting layer 122 may not be uniformly deposited due, e.g., to particles that may exist on the lower electrode 121. Therefore, the upper electrode 123 may be connected to the lower electrode 121 at a junction where the particles exist. Therefore, the light emitting unit 120 may short circuit, resulting in a dark spot. As a result, a light emitting region may be reduced, deteriorating picture quality.

SUMMARY OF THE INVENTION

The present invention is therefore directed to an organic light emitting display, a method of fabricating the same, and a mobile display including the organic light emitting display, which substantially overcomes one or more of the problems due to the limitations and disadvantages of the related art.

It is therefore a feature of an embodiment of the present invention to insulate the upper and lower electrodes from each other to prevent a dark spot from being generated.

It is therefore another feature of an embodiment of the present invention to provide a buffer layer on the upper electrode that can render a predetermined thickness of the upper electrode non-conductive.

It is therefore yet another feature of an embodiment of the present invention to provide an organic light emitting display that is capable of reducing or preventing a dark spot from being generated.

It is therefore still another feature of an embodiment of the present invention to provide a method of fabricating the organic light emitting display that is capable of reducing or preventing a dark spot from being generated.

It is therefore still another feature of an embodiment of the present invention to provide a mobile display including the organic light emitting display that is capable of reducing or preventing a dark spot from being generated.

At least one of the above and other features and advantages of the present invention may be realized by providing an organic light emitting display, including a transistor on a substrate, a lower electrode on the substrate, the lower electrode being electrically connected to the transistor, an organic light emitting layer on the lower electrode, an upper electrode on the organic light emitting layer, and a buffer layer formed on the upper electrode to modify a predetermined thickness of the upper electrode to be non-conductive material.

The buffer layer may be about 10 Å to 100 Å thick. The predetermined thickness of the upper electrode may be about 100 Å to 30 Å. The non-conductive material of the predetermined thickness may be an oxide.

The buffer layer may be a polyol-based buffer layer. The polyol of which the polyol-based buffer layer may be formed may be a compound including at least two OH groups in one molecule.

The upper electrode may have a smaller work function than the lower electrode.

The organic light emitting display may include at least one protective layer on the buffer layer. The protective layer may be a passivation layer or a capping layer.

The organic light emitting layer may include at least one organic layer having at least one of a hole injecting layer, a hole transporting layer, an electron transporting layer, and an electron injecting layer.

At least one of the above and other features and advantages may be realized by providing a method of fabricating an organic light emitting display, the method including forming a lower electrode electrically connected to a transistor on a substrate, forming an organic light emitting layer on the lower electrode, forming an upper electrode on the organic light emitting layer, and forming a buffer layer on the upper electrode in order to modify a predetermined thickness of the upper electrode to be a non-conductive material.

At least one of the above and other features and advantages may be realized by providing a mobile display including a display main body having a picture unit for displaying a picture, the picture unit including an organic light emitting display having any of the above elements.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION THE INVENTION

Figure 1:
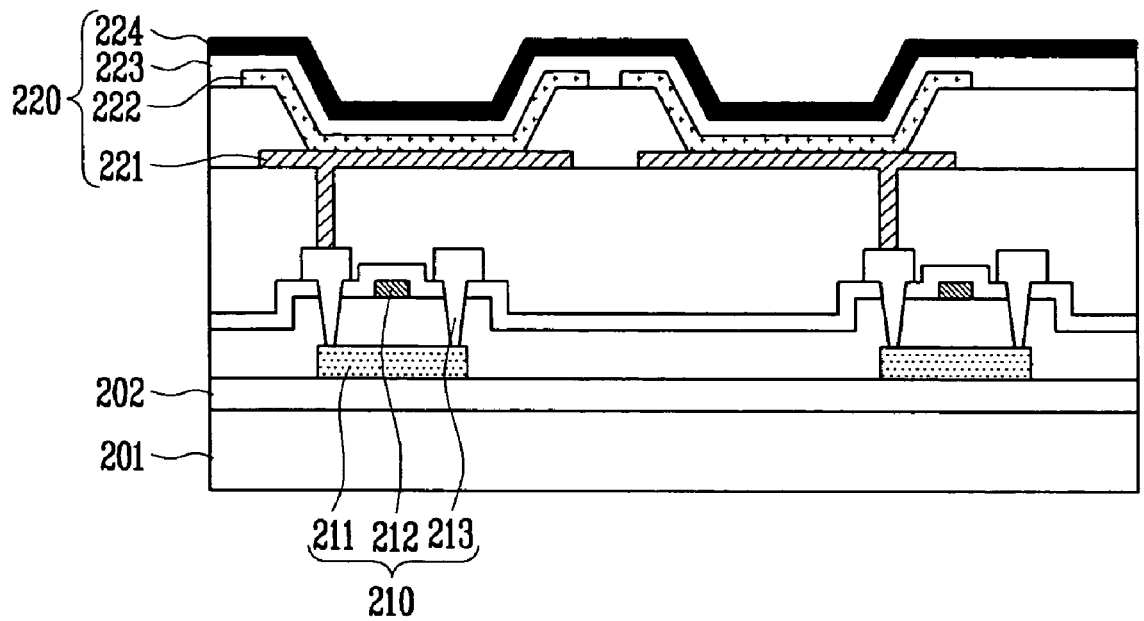
FIG. 1 illustrates a cross-sectional view of an organic light emitting display according to a first embodiment of the present invention.

Korean Patent Application No. 10-2005-0099381, filed on Oct. 20, 2005, in the Korean Intellectual Property Office, and entitled: "Organic Light Emitting Display, Method of Fabricating the Same, and Mobile Display Including the Organic Light Emitting Display," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As discussed in detail below, upper and lower electrodes of a light emitting unit for use in an organic light emitting display (OLED) may be insulated from each other, even when an organic light emitting layer does not completely insulate these electrodes, in accordance with various configurations, thus reducing or preventing formation of a dark spot, improving image quality. By converting a predetermined thickness of an upper electrode into a non-conductive material, any inadvertent contact between the upper and lower electrodes due to discontinuities in the organic light emitting layer may not resort in shorting the light emitting unit.

Referring to FIG. 1, an organic light emitting display (OLED) according to an embodiment of the present invention may include a thin film transistor (TFT) 210 formed on a substrate 201, and a light emitting unit 220. The TFT 210 may include a semiconductor layer 211, a gate electrode 212, and source-drain electrodes 213. The light emitting unit 220 may include a lower electrode 221 on the substrate electrically connected to the TFT 210, an organic light emitting layer 222 on the lower electrode, an upper electrode 223 on the organic light emitting layer, and a buffer layer, e.g., a polyol-based buffer layer 224, on the upper electrode 223. The polyol-based buffer layer 224 may render a predetermined thickness of the upper electrode to be non-conductive, i.e., may modify the predetermined thickness of the upper electrode to be a non-conductive material, e.g., to be an oxide.

Figure 2:
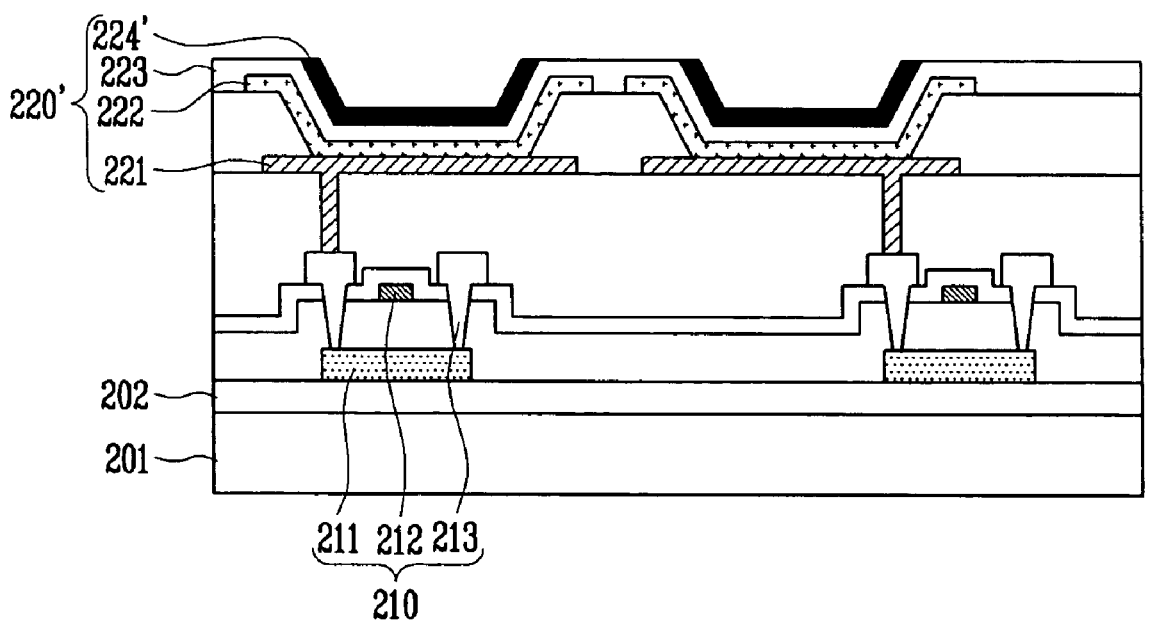
FIG. 2 illustrates a cross-sectional view of an organic light emitting display according to a second embodiment of the present invention.

In a first embodiment of the present invention, as illustrated in FIG. 1, the polyol-based buffer layer 224 may extend over an entire OLED structure, i.e., may be continuous. Alternatively, an OLED according to a second embodiment of the present invention, as illustrated in FIG. 2, a light emitting unit 220' may include a polyol-based buffer layer 224' that may only extend within a contact hole for each light emitting unit, i.e., may be discontinuous. All of the other elements of the OLED may be the same as those in FIG. 1, so discussion thereof will not be repeated.

Figure 3:
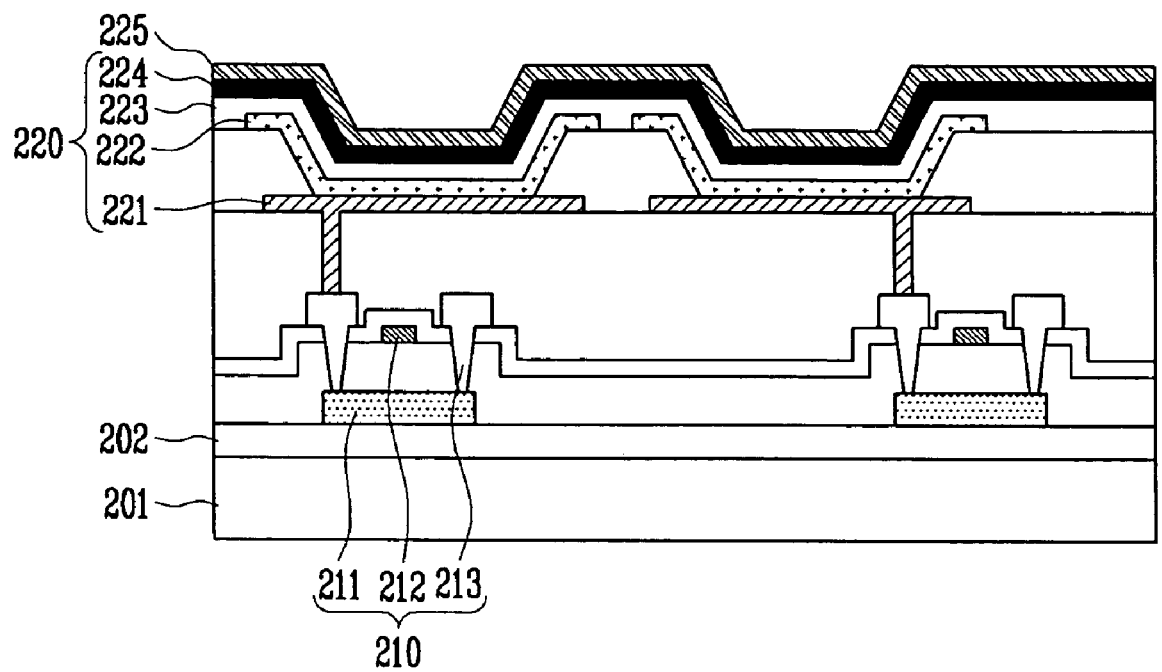
FIG. 3 illustrates a cross-sectional view of an organic light emitting display according to a third embodiment of the present invention.
Figure 4:
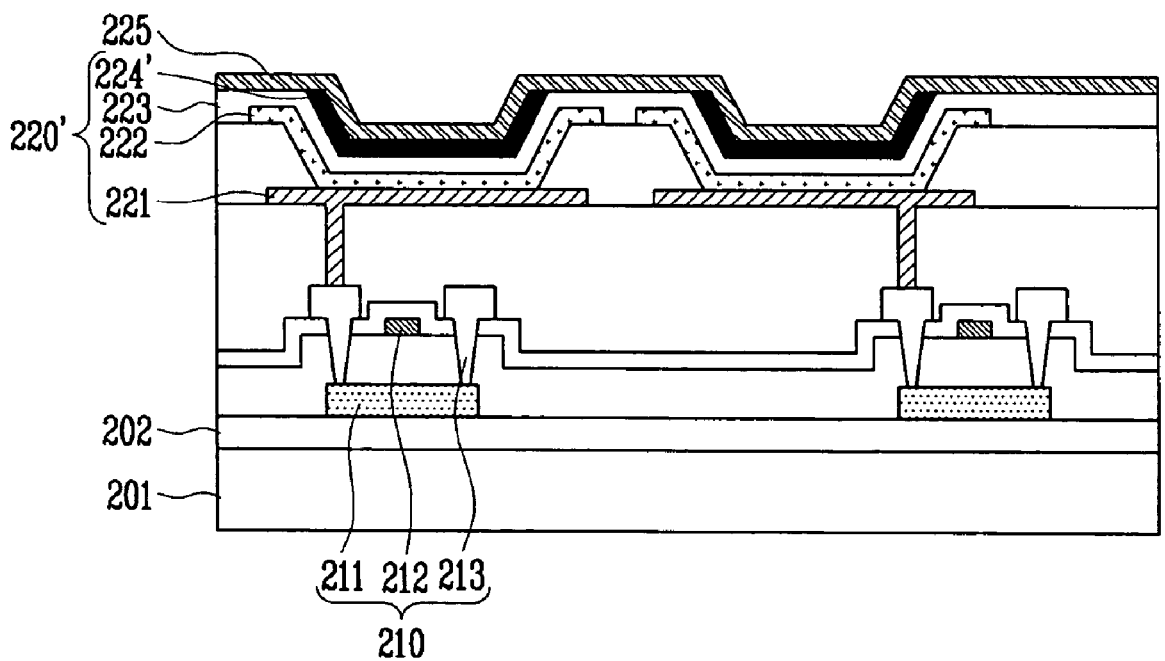
FIG. 4 illustrates a cross-sectional view of an organic light emitting display according to a fourth embodiment of the present invention.

Referring to FIGS. 3 and 4, an OLED according to third and fourth embodiments of the present invention may further include a capping layer 225 on the polyol-based buffer layer 224, 224' of FIGS. 2 and 3, respectively. All of the other elements of the OLED may be the same as those in FIGS. 2 and 3, so discussion thereof will not be repeated.

Figure 5:
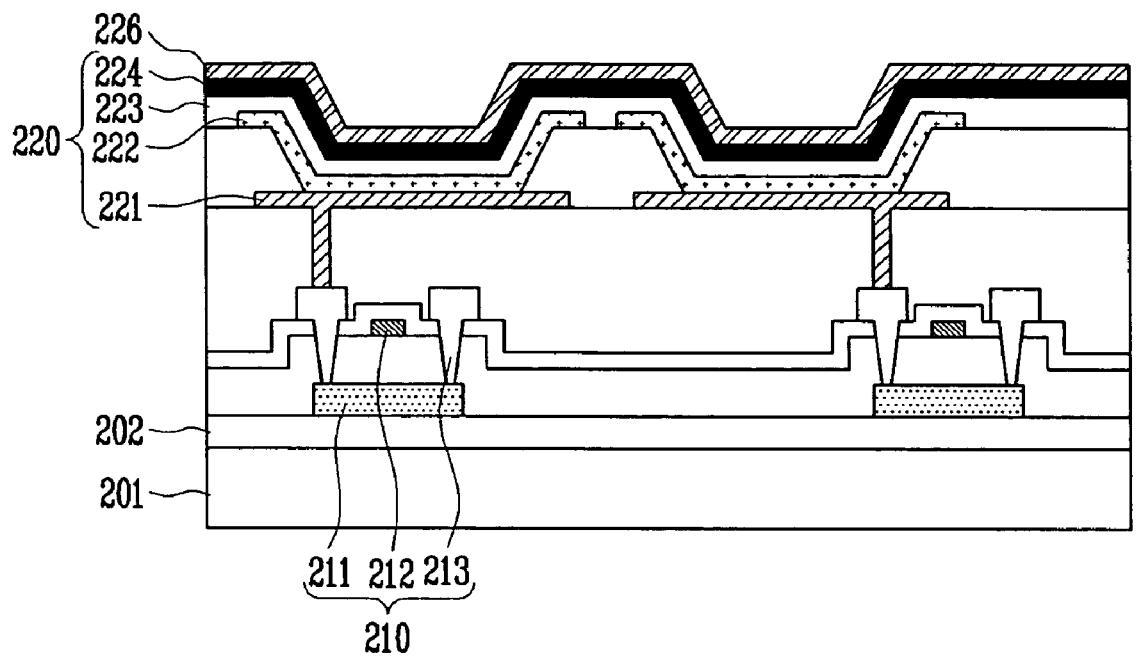
FIG. 5 illustrates a cross-sectional view of an organic light emitting display according to a fifth embodiment of the present invention.
Figure 6:
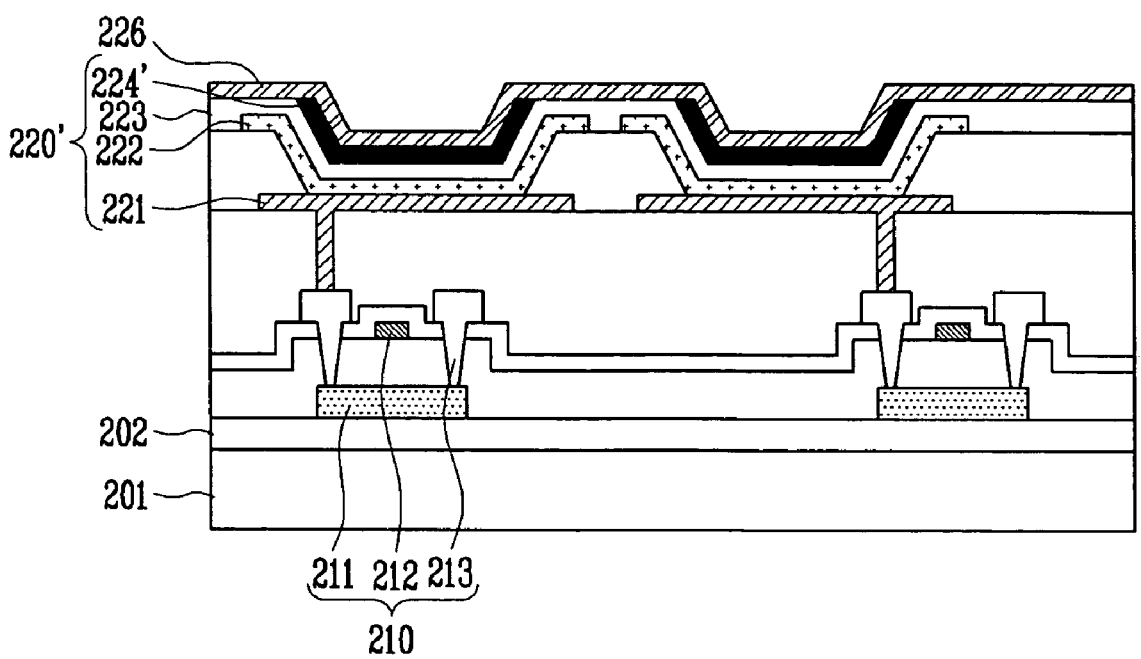
FIG. 6 illustrates a cross-sectional view of an organic light emitting display according to a sixth embodiment of the present invention.
Figure 7:
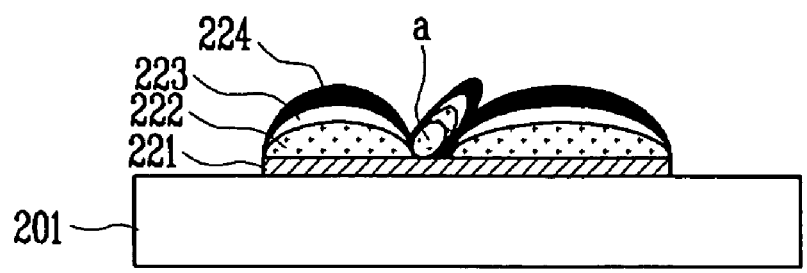
FIG. 7 illustrates a detailed schematic cross-sectional diagram of a light emitting unit according to embodiments of the present invention.

Referring to FIGS. 4 and 5, an OLED according to fifth and sixth embodiments of the present invention may further include a passivation layer 226 on the polyol-based buffer layer 224, 224' of FIGS. 2 and 3, respectively. All of the other elements of the OLED may be the same as those in FIGS. 1 and 2, respectively, so discussion thereof will not be repeated.

The thin film transistor 210 formed on the substrate 201 may be formed by a method that is common in the art to have a structure that is common in the art. For example, a buffer layer 202 may be selectively formed on the substrate 201. Then, a semiconductor layer 211, including source-drain regions, may be formed on the buffer layer. After forming a gate insulating layer on the substrate including the semiconductor layer 211 and forming a gate electrode 212 on the gate insulating layer, source-drain electrodes 213 connected to the source-drain regions through contact holes may be formed on the interlayer insulating layer to form the thin film transistor 210.

A light emitting unit 220 electrically connected to the thin film transistor 210 may be formed on the substrate where the thin film transistor 210 is formed. To be specific, a lower electrode 221 may be electrically connected to one of the source-drain electrodes 213 of the thin film transistor 210 through a via hole formed on the passivation layer formed on the substrate 200.

A conventional substrate for an OLED, e.g., a glass substrate or a transparent plastic substrate having excellent transparency, surface flatness, and is easily dealt with and waterproof, may be used as the substrate 201.

The lower electrode 221 formed on the substrate may be an anode electrode or a cathode electrode, and may be a reflective electrode or a transmissive electrode in accordance with front surface emission or rear surface emission operation of the OLED.

The lower electrode 211 may be an anode electrode. When the lower electrode 221 is the anode electrode, the lower electrode 221 may be formed of a conductive material, e.g., a metal or an oxide, that has a high work function and into which holes may be easily injected, e.g., indium tin oxide (ITO), indium zinc oxide (IZO), Ni, Pt, Au, and Ir.

An organic light emitting layer 222 may be formed on the lower electrode 221. The organic light emitting layer 222 may include an emission layer and at least one organic layer in addition to the emission layer. The at least one organic layer may have at least one of a hole injecting layer, a hole transporting layer, a hole suppressing layer, an electron transporting layer, and an electron injecting layer. Any of the emission layer, the hole injecting layer, the hole transporting layer, the hole suppressing layer, the electron transporting layer, and the electron injecting layer may be formed with methods and materials commonly used in the art.

For example, the hole injecting layer may be formed of CuPc or Starburst type amine by deposition or spin coating, although not limited to the above. The hole transporting layer may be formed of materials having hole transporting properties, e.g., N'-diphenyl-N,N'-bis(3-methylphenyl) 1,1-biphenyl 4,4'-diamine (hereinafter, TPD) by deposition, spin coating, etc. The emission layer may be formed of light emitting materials, e.g., aluminum tris(8-hydroxyquinoline) (Alq3), by deposition, spin coating, etc. The electron transporting layer may be formed of oxadiazole-based derivative by deposition, spin coating, etc.

The upper electrode 223 may be formed on the organic light emitting layer 222. The upper electrode 223 may be an anode electrode or a cathode electrode. When the upper electrode 223 is the cathode electrode, the cathode electrode may be formed of metals, e.g., Li, Mg, Al, Al—Li, Ca, Mg—In, Mg—Ag, etc. Therefore, the structure of the light emitting unit 220, 220' may vary from the lower electrode/the organic light emitting layer/the upper layer to the lower electrode/the hole injecting layer/the hole transporting layer/the organic light emitting layer/the hole suppressing layer/the electron transporting layer/the electron injecting layer/the upper electrode.

Figure 8:
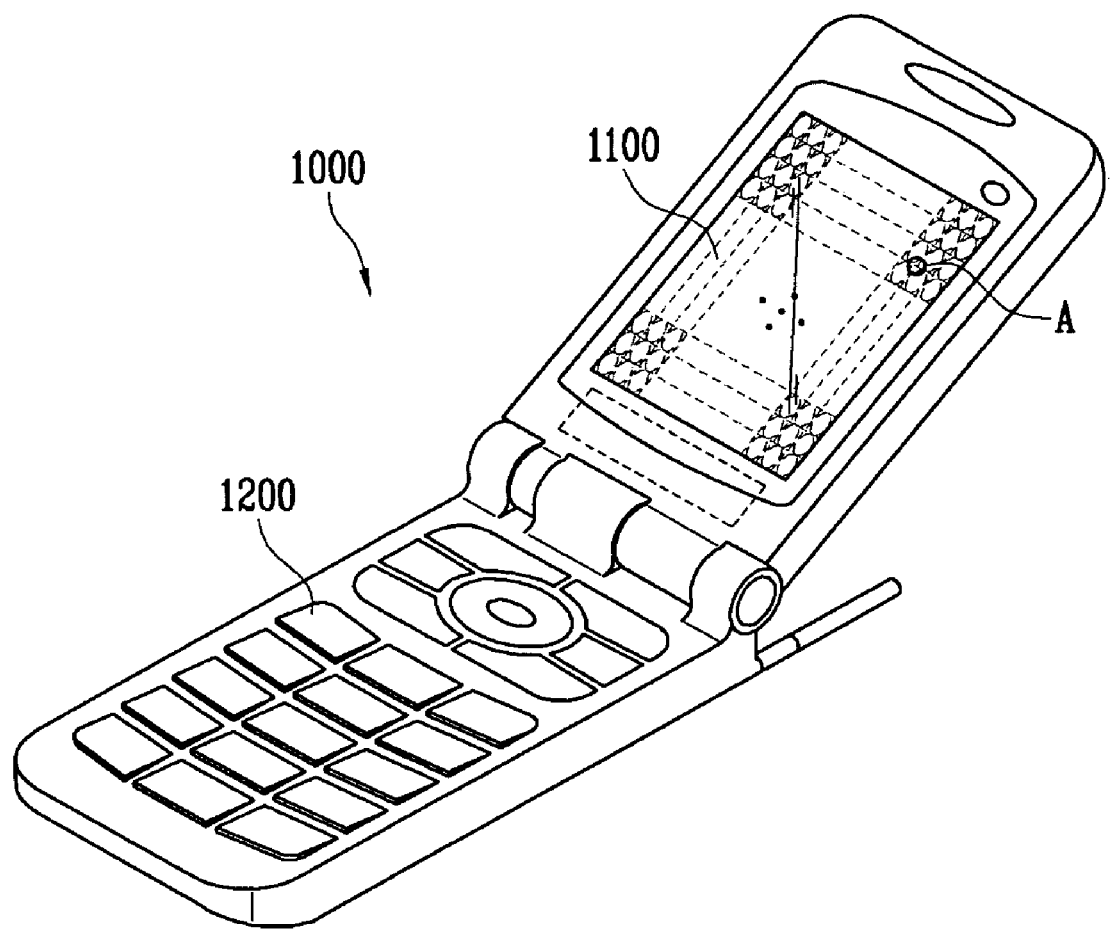
FIG. 8 illustrates as schematic a mobile display including the organic light emitting display according to an embodiment of the present invention.

A polyol-based buffer layer 224 may be formed on the upper electrode 223 by a method such as deposition, spin coating, etc., under the conditions similar to those used for forming the above layers. As illustrated in FIG. 8, in order to prevent the upper electrode 223 from being shorted due to a connection between the upper electrode 223 and the lower electrode 221 that may arise when the organic light emitting layer 222 is not uniformly deposited, e.g., due to particles that may exist on the lower electrode 221, the polyol-based buffer layer 224 modifies a predetermined thickness of the upper electrode 223 to be non-conductive, so that the upper and lower electrodes are insulated from each other. In order to modify the predetermined thickness of the upper electrode to be non-conductive, the predetermined thickness of the upper electrode 223 may be modified, e.g., to be an oxide or a nitride.

The predetermined thickness of the upper electrode 223 may be modified to be a non-conductive oxide by forming the polyol-based buffer layer 224 on the upper electrode 223. That is, the —OH group of polyol may oxidize the metal of the upper electrode 223. In this case, oxidation occurs during formation of the —OH group of the polyol-based buffer layer 224, 224'.

The thickness of the polyol-based buffer layer 224, 224' may be about 10 Å to 100 Å. Due to the oxidation of the upper electrode by the buffer layer having this thickness, the predetermined thickness of the non-conductive oxide layer will be less than 100 Å, e.g., between 10 Å to 30 Å. The predetermined thickness should have a thickness relative to a total thickness of the upper electrode, i.e., above which the upper electrode would no longer function correctly or below which not enough of the upper electrode is non-conductive to avoid short circuiting. The polyol-based buffer layer 224, 224' may be formed on the upper electrode 223 or may surround the sides and the front surface of the upper electrode 223.

The polyol of which the buffer layer may be a compound having two or more —OH groups including, e.g., a monosaccharide such as glucose, fructose, mannose, galactose, or ribose, a disaccharide such as sucrose, maltose, or lactose, ethylene glycol, propylene glycol, 1,3-propandiol, 1,3-butanediol, 1,4-butanediol, 1,5-pentanediol, 1,6-hexanediol, neopentyl glycol, diethylene glycol, dipropylene glycol, triethylene glycol, tetraethylene glycol, dibutylene glycol, 2-methyl-1,3-pentanediol, 2,2,4-trimethyl-1,3-pentanediol, 1,4-cyclohexanedimethanol, etc.

In the meantime, the predetermined thickness of the upper electrode 223 may be modified to be a non-conductive nitride by forming the amine-based buffer layer 224 on the upper electrode 223. The particular materials for modifying the upper electrode into the nitride are amine-based compounds, such as amylamine, ethylamine, methylamine, phenylamine, propylamine and so on.

At least one protective layer for protecting the organic light emitting layer 222 may be formed on the polyol-based buffer layer 224, 224'. The capping layer 225 or the passivation layer 226 may be used as the protective layer. The capping layer 225 and the passivation layer 226 may be formed, e.g., by deposition or spin coating, transparent materials that are commonly used in the art.

Figure 9:
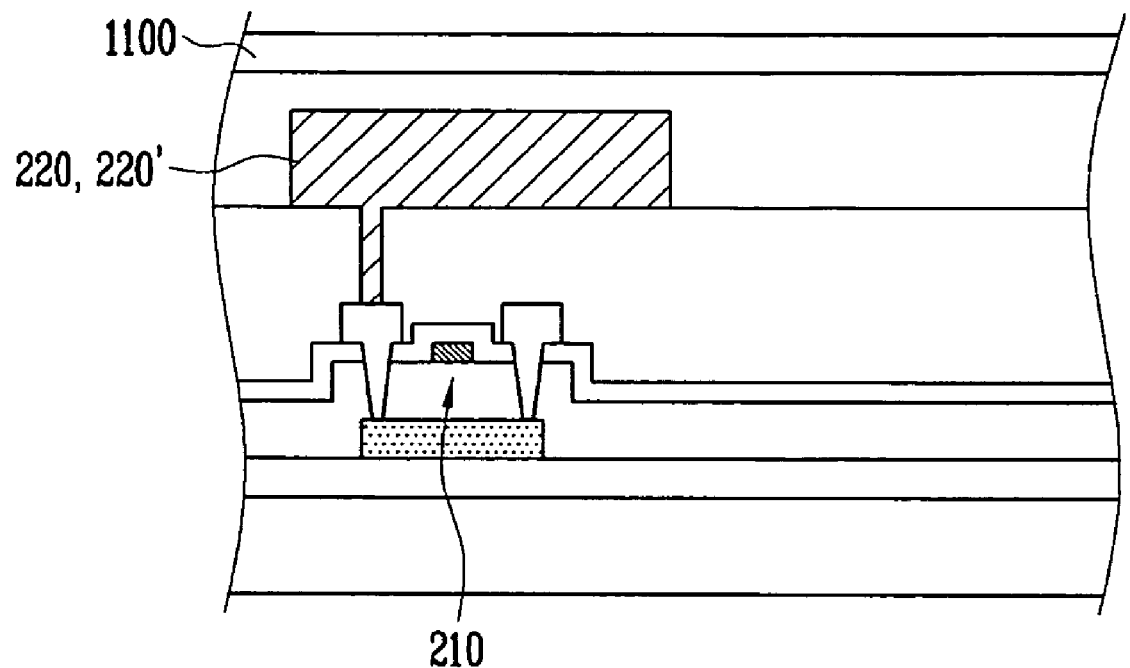
FIG. 9 illustrates an enlarged cross-sectional view of part A of FIG. 8.
Figure 10:
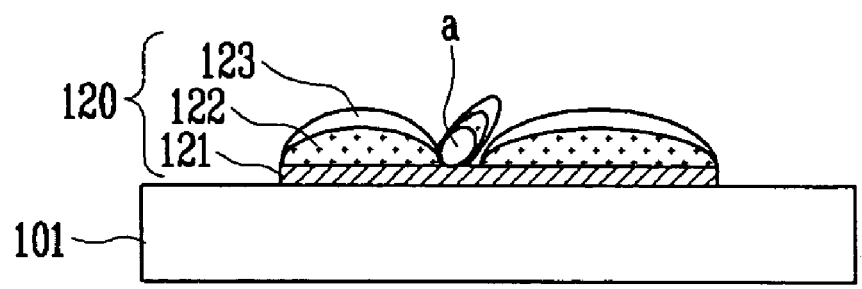
FIG. 10 illustrates a detailed schematic cross-sectional diagram of a conventional light emitting unit for use in a conventional organic light emitting display.

Referring to FIGS. 8 and 9, a mobile display 1000 may include a picture unit 1100 for displaying a picture and a display main body including a plurality of operation button units 1200. As illustrated in the cross-sectional detail of FIG. 9, the OLED having the light emitting unit 220, 220' and the transistor 210 according to any of the exemplary embodiments of the present invention may be provided in the picture unit 1100.

The OLED according to the present invention may be applied to various displays, e.g., a personal digital assistant (PDA), an electronic pager, a video camera, a workstation, a picture telephone etc., besides the mobile telephone 1000 illustrated in FIG. 9.

As described above, according to the present invention, the polyol-based buffer layer may be formed on the upper electrode so that the predetermined thickness of the upper electrode is rendered non-conductive. Thus, even if the organic light emitting layer is non-uniformly deposited, e.g., due to particles that may exist on the lower electrode, only the non-conductive surface of the upper electrode will contact the lower electrode. Therefore, it is possible to prevent the light emitting unit from being shorted, to prevent the dark point from being generated, and to improve picture quality.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display, comprising:
   a transistor on a substrate;
   a lower electrode on the substrate, the lower electrode being electrically connected to the transistor;
   an organic light emitting layer on the lower electrode;
   an upper electrode on the organic light emitting layer, a predetermined thickness of the upper electrode being a non-conductive material; and
   a buffer layer on the upper electrode, the buffer layer modifying the predetermined thickness of the upper electrode to be the non-conductive material, and the predetermined thickness of the upper electrode being about 10 Å to 30 Å.

2. The organic light emitting display as claimed in claim 1, wherein a thickness of the buffer layer is about 10 Å to 100 Å.

3. The organic light emitting display as claimed in claim 1, wherein:
   the buffer layer includes a polyol, and
   the non-conductive material is an oxide.

4. The organic light emitting display as claimed in claim 1, wherein the upper electrode is a cathode.

5. The organic light emitting display as claimed in claim 1, further comprising at least one protective layer on the buffer layer.

6. The organic light emitting display as claimed in claim 5, wherein the protective layer is a passivation layer or a capping layer.

7. The organic light emitting display as claimed in claim 1, wherein the organic light emitting layer further comprises at least one organic layer including at least one of a hole injecting layer, a hole transporting layer, an electron transporting layer, and an electron injecting layer.

8. The organic light emitting display as claimed in claim 1, wherein:
the buffer layer includes an amine, and
the non-conductive material is a nitride.

9. A method of fabricating an organic light emitting display, the method comprising:
forming a lower electrode electrically connected to a transistor on a substrate;
forming an organic light emitting layer on the lower electrode;
forming an upper electrode on the organic light emitting layer;
forming a buffer layer on the upper electrode; and
modifying a predetermined thickness of the upper electrode to be a non-conductive material, the predetermined thickness of the upper electrode being modified by the buffer layer, and the predetermined thickness of the upper electrode being about 10 Å to 30 Å.

10. A method of fabricating an organic light emitting display as claimed in claim 9, wherein modifying the predetermined thickness of the upper electrode to be the non-conductive material includes reacting a polyol or an amine in the buffer layer with the upper electrode to form the non-conductive material.

11. A mobile display including a display main body having a picture unit for displaying a picture, the picture unit including an organic light emitting display comprising:
a transistor on a substrate;
a lower electrode on the substrate, the lower electrode being electrically connected to the transistor;
an organic light emitting layer on the lower electrode;
an upper electrode on the organic light emitting layer, a predetermined thickness of the upper electrode being a non-conductive material; and
a buffer layer on the upper electrode, the buffer layer modifying the predetermined thickness of the upper electrode to be the non-conductive material, and the predetermined thickness of the upper electrode being about 10 Å to 30 Å.

12. The mobile display as claimed in claim 11, wherein the thickness of the buffer layer is about 10 Å to 100 Å.

13. The mobile display as claimed in claim 11, wherein:
the buffer layer includes a polyol, and
the non-conductive material is an oxide.

14. The mobile display as claimed in claim 11, wherein the upper electrode is a cathode.

15. The mobile display as claimed in claim 11 further comprising at least one protective layer formed on the buffer layer.

16. The mobile display as claimed in claim 15, wherein the protective layer is a passivation layer or a capping layer.

17. The mobile display as claimed in claim 11, wherein the organic light emitting layer further comprises at least one organic layer including at least one of a hole injecting layer, a hole transporting layer, an electron transporting layer, and an electron injecting layer.

18. The mobile display as claimed in claim 11, wherein:
the buffer layer includes an amine, and
the non-conductive material is a nitride.

* * * * *